United States Patent
Wang et al.

(10) Patent No.: US 9,837,507 B1
(45) Date of Patent: Dec. 5, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yu-Sheng Wang, Tainan (TW);
Chi-Cheng Hung, Tainan (TW);
Da-Yuan Lee, Hsinchu County (TW);
Hsin-Yi Lee, Hsinchu (TW);
Kuan-Ting Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/281,305

(22) Filed: Sep. 30, 2016

(51) Int. Cl.
*H01L 29/66* (2006.01)
*H01L 29/49* (2006.01)

(52) U.S. Cl.
CPC .... *H01L 29/66545* (2013.01); *H01L 29/4966* (2013.01)

(58) Field of Classification Search
CPC ............. H01L 21/8234; H01L 21/8238; H01L 29/6545; H01L 29/78; H01L 29/42376; H01L 29/4966; H01L 29/66545
See application file for complete search history.

(56) References Cited

U.S. PATENT DOCUMENTS

| | | | |
|---|---|---|---|
| 9,490,255 B1* | 11/2016 | Edge ................... | H01L 27/0924 |
| 2010/0065925 A1* | 3/2010 | Huang ............. | H01L 29/42376 257/410 |
| 2011/0001195 A1* | 1/2011 | Park ................ | H01L 21/823842 257/369 |
| 2012/0104469 A1* | 5/2012 | Li ..................... | H01L 29/42368 257/288 |

* cited by examiner

*Primary Examiner* — Caridad Everhart
(74) *Attorney, Agent, or Firm* — McDermott Will & Emery LLP

(57) ABSTRACT

A field effect transistor includes a channel layer made of a semiconductor and a metal gate structure. The metal gate structure includes a gate dielectric layer, a barrier layer formed on the gate dielectric layer, a work function adjustment layer formed on the barrier layer and made of one of Al and TiAl, a blocking layer formed on the work function adjustment layer and made of TiN, and a body metal layer formed on the blocking layer and made of W. A gate length over the channel layer is in a range from 5 nm to 15 nm, and a thickness of the first conductive layer is in a range of 0.2 nm to 3.0 nm. A range between a largest thickness and a smallest thickness of the first conductive layer is more than 0% and less than 10% of an average thickness of the first conductive layer.

16 Claims, 7 Drawing Sheets

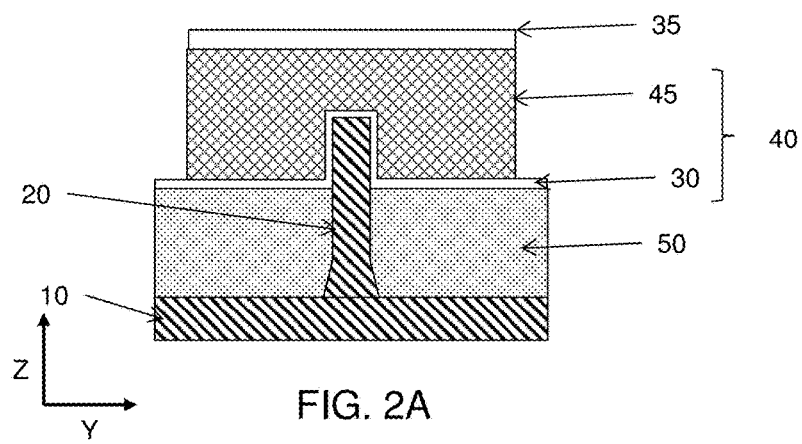
FIG. 2A
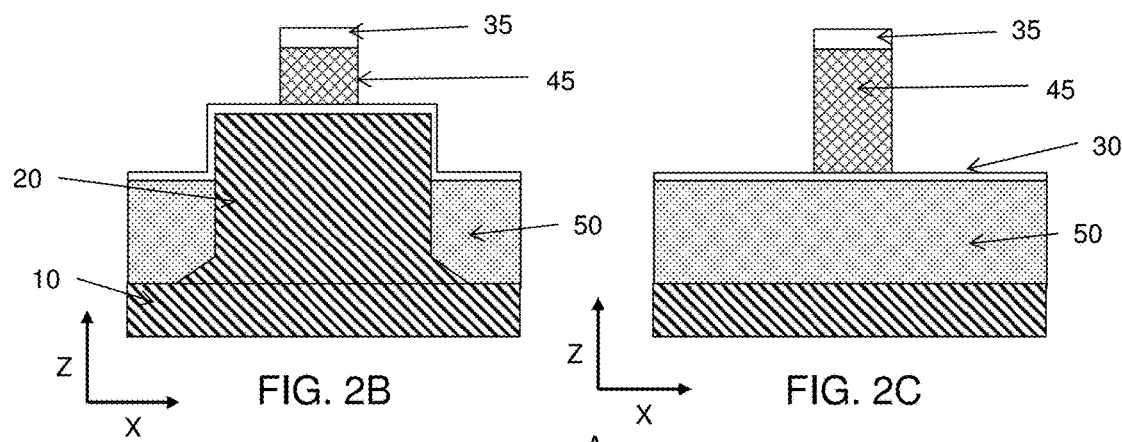
FIG. 2B
FIG. 2C
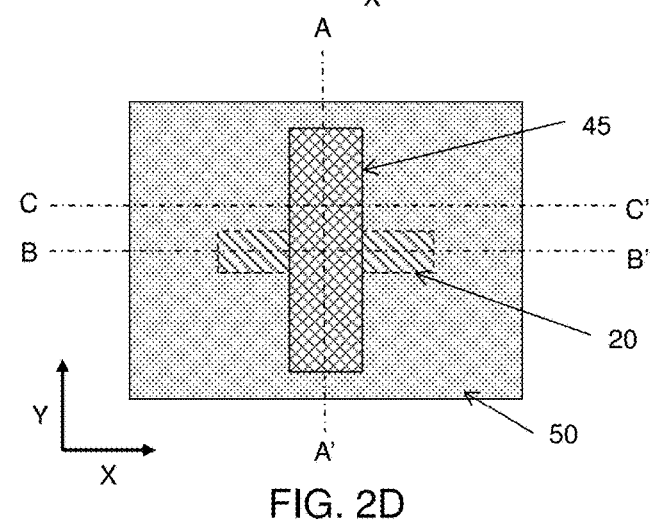
FIG. 2D

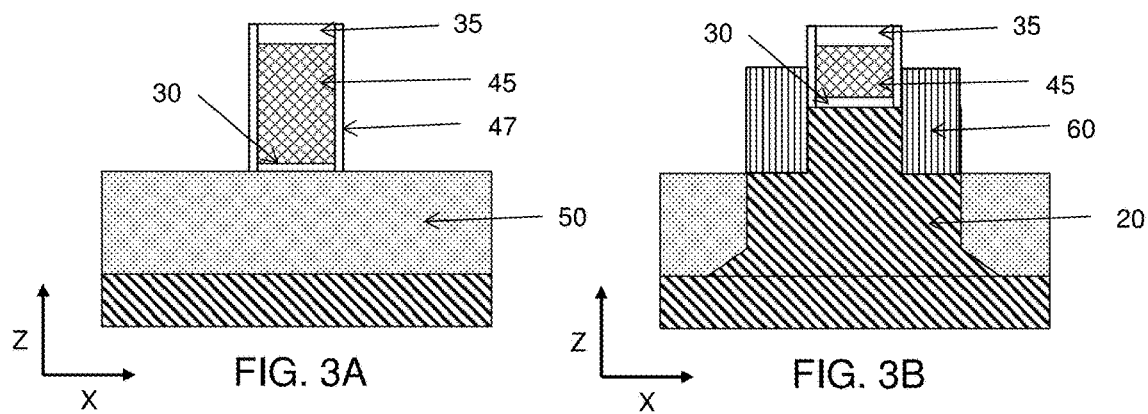
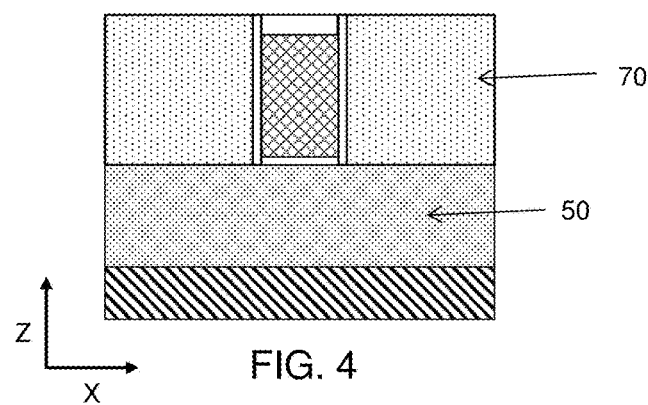
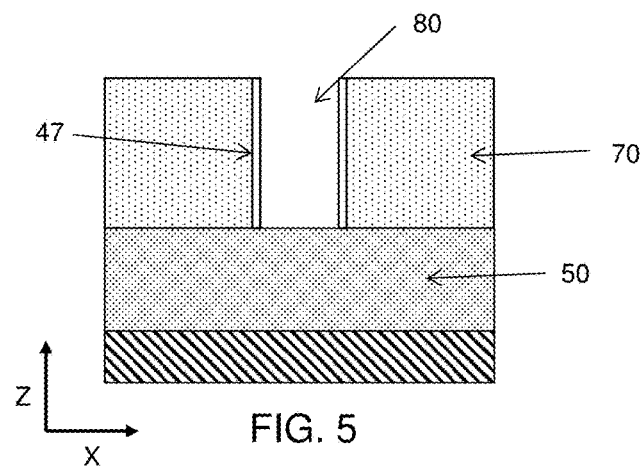

US 9,837,507 B1

SEMICONDUCTOR DEVICE AND MANUFACTURING METHOD THEREOF

TECHNICAL FIELD

The disclosure relates to a semiconductor integrated circuit, more particularly to a semiconductor device having a metal gate structure and its manufacturing process.

BACKGROUND

As the semiconductor industry has progressed into nanometer technology process nodes in pursuit of higher device density, higher performance, and lower costs, challenges from both fabrication and design issues have resulted in the use of a metal gate structure with a high-k (dielectric constant) material. The metal gate structure is often manufactured by using gate replacement technologies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-12 show exemplary views of various stages for manufacturing a semiconductor FET device according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
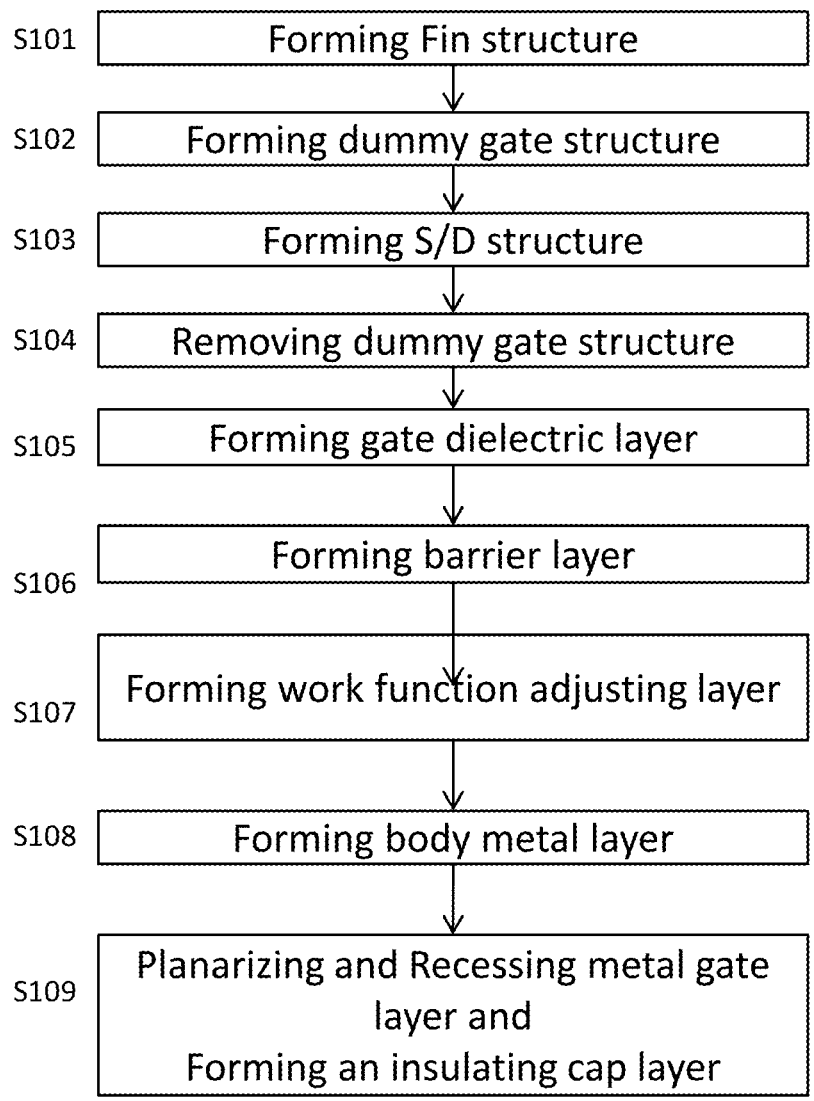
FIG. 1 is an exemplary flow chart for manufacturing a semiconductor FET device according to one embodiment of the present disclosure.

FIG. 1 is an exemplary flow chart for manufacturing a semiconductor FET device having a fin structure (Fin FET). The flow chart illustrates only a relevant part of the entire manufacturing process for a Fin FET device. It is understood that additional operations may be provided before, during, and after the operations shown by FIG. 1, and some of the operations described below can be replaced or eliminated for additional embodiments of the method. The order of the operations/processes may be interchangeable.

FIGS. 2A-2C are exemplary cross sectional views of the Fin FET device at one of the various stages of the fabrication process according to one embodiment. FIG. 2D is a planar view, FIG. 2A is a cross sectional view along the line A-A' of FIG. 2D, FIG. 2B is a cross sectional view along the line B-B' of FIG. 2D and FIG. 2C is a cross sectional view along the line C-C' of FIG. 2D.

In S101 of FIG. 1, a fin structure 20 is fabricated over a substrate 10. The fin structure 20 is formed over a substrate 10 and protrudes from an isolation insulating layer 50. The portion of the fin structure 20 protruding from the isolation insulating layer 50 functions as a channel layer.

To fabricate a fin structure according to one embodiment, a mask layer is formed over a substrate 10. The mask layer is formed by, for example, a thermal oxidation process and/or a chemical vapor deposition (CVD) process. The substrate 10 is, for example, a p-type silicon substrate with an impurity concentration in a range of about $1 \times 10^{15}$ cm$^{-3}$ to about $2 \times 10^{15}$ cm$^{-3}$. In other embodiments, the substrate 10 is an n-type silicon substrate with an impurity concentration in a range of about $1 \times 10^{15}$ cm$^{-3}$ to about $2 \times 10^{15}$ cm$^{-3}$. The mask layer includes, for example, a pad oxide (e.g., silicon oxide) layer and a silicon nitride mask layer in some embodiments.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LP-CVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a resist pattern formed by lithography operations.

By using the mask pattern as an etching mask, a hard mask pattern of the pad oxide layer and the silicon nitride mask layer is formed. The width of the hard mask pattern is in a range of about 5 nm to about 40 nm in some embodiments. In certain embodiments, the width of the hard mask patterns is in a range of about 7 nm to about 12 nm.

By using the hard mask pattern as an etching mask, the substrate is patterned into a fin structure 20 by trench etching using a dry etching method and/or a wet etching method. A height of the fin structure 20 is in a range of about 20 nm to about 300 nm. In certain embodiments, the height is in a range of about 30 nm to about 60 nm. When the heights of the fin structures are not uniform, the height from the substrate may be measured from the plane that corresponds to the average heights of the fin structures. The width of the fin structure 20 is in a range of about 7 nm to about 15 nm.

In this embodiment, a bulk silicon wafer is used as the substrate 10. However, in some embodiments, other types of substrate may be used as the substrate 10. For example, a silicon-on-insulator (SOI) wafer may be used as a starting material, and the insulator layer of the SOI wafer constitutes the substrate 10 and the silicon layer of the SOI wafer is used for the fin structure 20.

As shown in FIGS. 2A-2D, one fin structure 20 extending in the X direction is disposed over the substrate 10. However, the number of the fin structure is not limited to one. The numbers may be two, three, four or five or more. In addition, one or more dummy fin structures may be disposed adjacent to both sides of the fin structure 20 to improve pattern fidelity in the patterning processes. The width of the fin structure 20 is in a range of about 5 nm to about 40 nm in some embodiments, and is in a range of about 7 nm to about 15 nm in certain embodiments. When multiple fin structures are disposed, the space between the fin structures is in a range of about 5 nm to about 80 nm in some embodiments, and is in a range of about 7 nm to about 15 nm in other embodiments. One skilled in the art will realize, however, that the dimensions and values recited throughout the descriptions are merely examples, and may be changed to suit different scales of integrated circuits.

In this embodiment, the Fin FET device is a p-type Fin FET. However, the technologies disclosed herein are also applicable to an n-type Fin FET.

After forming the fin structure 20, an isolation insulating layer 50 is formed over the fin structure 20.

The isolation insulating layer 50 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilyamine (TSA). These flowable silicon oxide materials are formed in a multiple-operation process in some embodiments. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN and/or fluoride-doped silicate glass (FSG) in some embodiments.

After forming the isolation insulating layer 50 over the fin structure 20, a planarization operation is performed so as to remove part of the isolation insulating layer 50 and the mask layer (the pad oxide layer and the silicon nitride mask layer). The planarization operation may include a chemical mechanical polishing (CMP) and/or an etch-back process. Then, the isolation insulating layer 50 is further removed so that the channel layer (upper layer) of the fin structure 20 is exposed.

In certain embodiments, the partially removing the isolation insulating layer 50 may be performed using a wet etching process, for example, by dipping the substrate in hydrofluoric acid (HF). In another embodiment, the partially removing the isolation insulating layer 50 may be performed using a dry etching process. For example, a dry etching process using $CHF_3$ or $BF_3$ as etching gases may be used.

After forming the isolation insulating layer 50, a thermal process, for example, annealing, may be performed to improve the quality of the isolation insulating layer 50. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

In S102 of FIG. 1, a dummy gate structure 40 is formed over part of the fin structure 20 as shown in FIGS. 2A-2D.

A dielectric layer and a poly silicon layer are formed over the isolation insulating layer 50 and the exposed fin structure, and then patterning operations are performed so as to obtain a dummy gate structure 40 including a dummy gate electrode layer 45 made of poly silicon and a dummy gate dielectric layer 30. The patterning of the poly silicon layer is performed by using a hard mask 35 including a silicon nitride layer formed over a silicon oxide layer in some embodiments. In other embodiments, the hard mask includes a silicon oxide layer formed over a silicon nitride layer. The dummy gate dielectric layer 30 may be silicon oxide formed by CVD, PVD, ALD, e-beam evaporation, or other suitable process. In some embodiments, the dummy gate dielectric layer 30 includes one or more layers of silicon oxide, silicon nitride, silicon oxy-nitride, or high-k dielectrics. In some embodiments, a thickness of the gate dielectric layer is in a range of about 0.5 nm to about 2 nm, and in a range of about 0.5 nm to about 1 nm in other embodiments.

In some embodiments, the dummy gate electrode layer 45 includes a single layer or multilayer structure. The dummy gate electrode layer 45 may be doped poly silicon with uniform or non-uniform doping. The dummy gate electrode layer 45 may be formed using a suitable process such as ALD, CVD, PVD, plating, or combinations thereof. In the present embodiment, the width of the dummy gate electrode layer 45 is in the range of about 30 nm to about 60 nm. In some embodiments, a thickness of the gate electrode layer is in a range of about 20 nm to about 400 nm, and is in a range of about 50 nm to 150 nm in other embodiments.

As shown in FIG. 3A, side-wall insulating layers 47 are formed over both main sides of the dummy gate electrode 45. FIG. 3A is an exemplary cross sectional view corresponding to line C-C' of FIG. 2D at one of the various stages of the fabrication process according to one embodiment.

The side-wall insulating layers 47 may include silicon oxide, silicon nitride, silicon oxy-nitride, or other suitable material. The side-wall insulating layers 47 may comprise a single layer or multilayer structure. A blanket layer of a side-wall insulating material may be formed by CVD, PVD, ALD, or other suitable technique. Then, an anisotropic etching is performed on the side-wall insulating material to form a pair of side-wall insulating layers (spacers) 47 on two main sides of the gate structure. The thickness of the side-wall insulating layers 47 is in a range of about 5 nm to about 30 nm in some embodiments, and in a range of about 10 nm to about 20 nm in other embodiments.

In S103 of FIG. 1, a source and a drain 60 are formed as shown in FIG. 3B. FIG. 3B is an exemplary cross sectional view corresponding to line B-B' of FIG. 2D at one of the various stages of the fabrication process according to one embodiment. The source and drain 60 may include a strain layer to apply stress to the channel layer. In some embodiments, the portions of the upper layer of the fin structure 20 not covered by the dummy gate structure 40 are etched down to form a recessed portions. Then, an appropriate strain layer is formed in the recessed portions. In some embodiments, the strain layer includes a single layer or multiple layers including SiGe for a p-type FET and SiP, SiC or SiCP for an n-type FET. The strain layer is epitaxially formed in the recessed portions.

As shown in FIG. 4 corresponding to line C-C' of FIG. 2, an interlayer dielectric (ILD) layer 70 is formed over the dummy gate structure 40 with the side wall insulating layers 47.

A dielectric material is formed over the dummy gate structure and the isolation insulating layer 50, and planarization operations, such as an etch back process and/or a chemical mechanical polishing (CMP) process, are performed, so as to obtain the structure shown in FIG. 4. The dielectric material for the interlayer dielectric layer 70 may include one or more layers of silicon oxide, silicon nitride, silicon oxynitride (SiON), SiOCN, fluorine-doped silicate glass (FSG), or a low-K dielectric material. The insulating material for the interlayer dielectric layer 70 may be the same as or different from that for the isolation insulating layer 50.

In S104 of FIG. 1, after the interlayer dielectric layer 70 is formed, as shown in FIG. 5, the dummy gate structure 40 is removed by dry etching and/or wet etching, so that a space 80 is formed. The depth of the space 80 is in a range of about 50 nm to about 400 nm, and may be in a range of about 100 nm to 200 nm. An aspect ratio of the space 80 may be in a range of 0.5 to 20 in some embodiments. As shown in FIG. 5, the side-wall insulating layers 47 remain in the space 80. In some embodiments, the side-wall insulating layers 47 are removed when removing the dummy gate structure 40.

Figure 6:
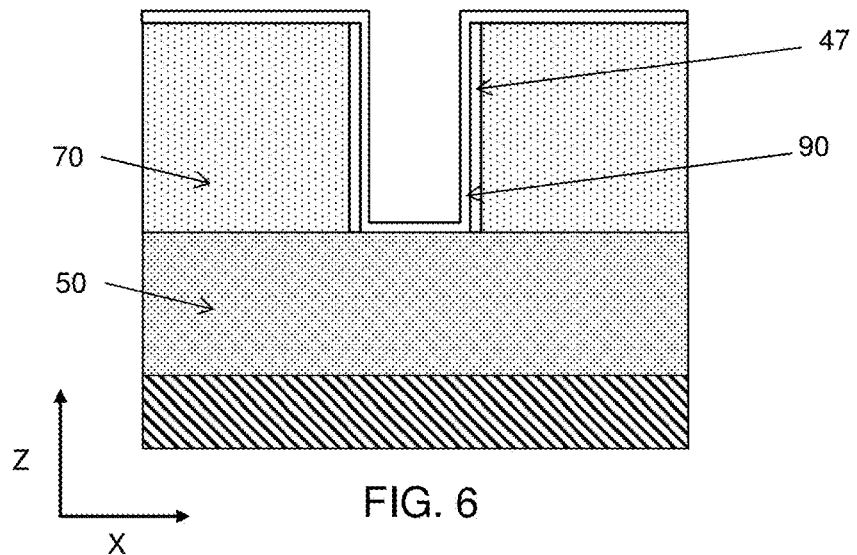

In S105 of FIG. 1, a gate dielectric layer 90 is formed in the space 80, as shown in FIG. 6. A gate dielectric layer 90 is formed over an interface layer (not shown) disposed over the channel layer of the fin structure 20. The interface layer includes silicon oxide with a thickness of 0.2 nm to 1.5 nm in some embodiments. The silicon oxide interface layer may be formed by oxidizing the Si channel layer. In other embodiments, the thickness of the interface layer is in a range about 0.5 nm to about 1.0 nm. In certain embodiments, the interface layer is not formed.

The gate dielectric layer 90 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 90 is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer 90 is in a range of about 0.5 nm to about 5 nm in some embodiments, and is in a range of about 1.0 nm to about 3.0 nm in other embodiments. In some embodiments, the gate dielectric layer 90 may include an interfacial layer made of silicon dioxide. The gate dielectric layer 90 is also formed on the upper surface of the interlayer dielectric layer 70.

Figure 7:
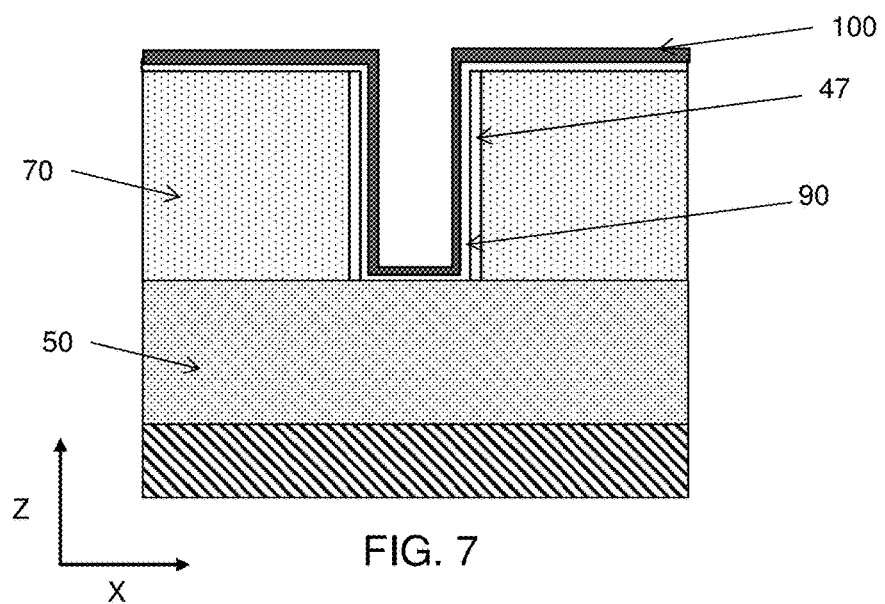
Figure 9:
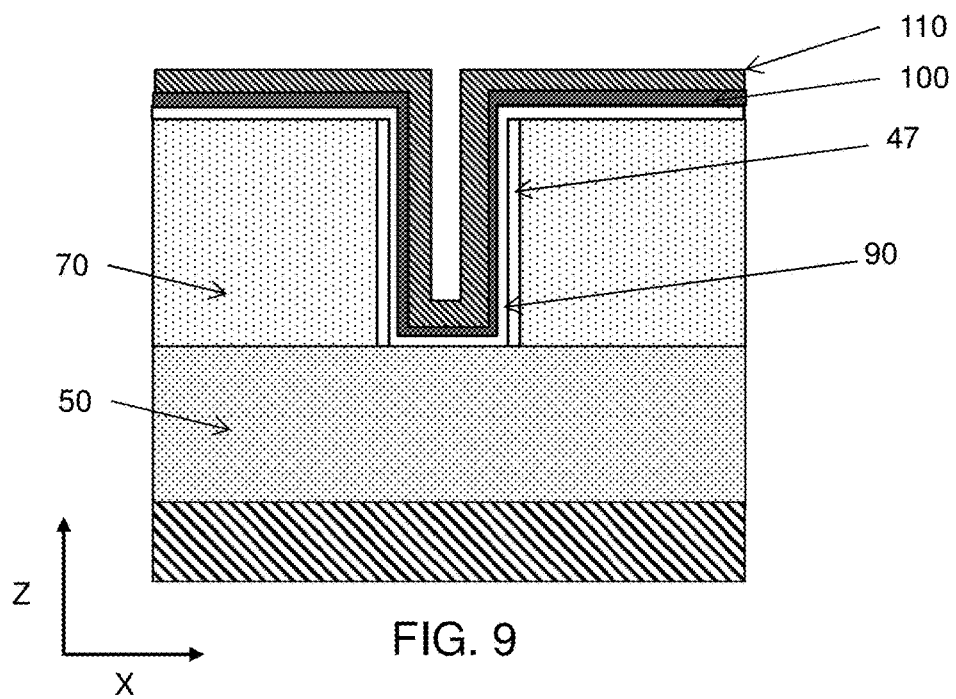

In S106 of FIG. 1, a first conductive layer, as a barrier layer, 100 is formed over the gate dielectric layer in the space 80, as shown in FIG. 7. Subsequently, in S107 of FIG. 1, a work function adjustment metal (WFM) layer 110 is formed over the barrier layer 100, as shown in FIG. 9.

The WFM layer 110 includes one or more layers of metal materials, such as TiN, TaN, TaAlC, TiC, TaC, Co, Al, TiAl, HfTi, TiSi, TaSi or TiAlC. In one some embodiments, the WFM layer 110 includes Al or TiAl, and has a thickness in a range from about 3.0 nm to about 10 nm.

As the gate length over the channel layer (the width of the gate electrode in the X direction) becomes less than about 15 nm, the effect of the WFM layer becomes insufficient because of the barrier layer (i.e., insufficient penetration of the WFM). Accordingly, if the thickness of the barrier layer is not reduced, a threshold voltage Vt of an n-channel FET increases as the gate length decreases. In particular, when the gate length is in a range from about 5 nm to about 15 nm and the thickness of the barrier layer is more than about 3.0 nm, the threshold voltage Vt of an n-channel FET increases as the gate length decreases.

The inventors of the present disclosure have found that, when the gate length is in the range from about 5 nm to about 15 nm and the thickness of the barrier layer is about 3.0 nm or less, the threshold voltage Vt decreases as the gate length decreases. More specifically, when the thickness of the barrier layer is in a range from about 0.2 nm to about 3.0 nm, the threshold voltage can be controlled to a desirable value as the gate length changes.

However, when the barrier layer is formed by CVD, PVD or ALD, the inventors have found that it is difficult to control the thickness of the barrier layer, in particular, to a thickness of 3.0 nm or less. To improve controllability of the barrier layer thickness, the operations as shown in FIGS. 8A-8C are employed in this embodiment to form a barrier layer with a high uniformity in the thickness.

Figure 8A:
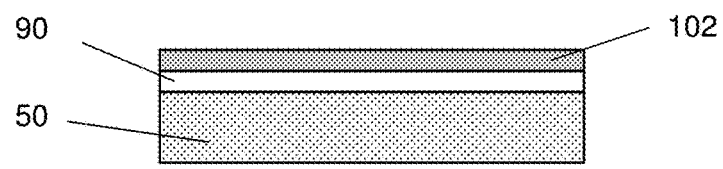

As shown in FIG. 8A, a TiN layer 102, as a lower barrier layer, is formed on the gate dielectric layer 90. The TiN layer 102 can be formed by CVD, PVD or ALD and the thickness of the TiN layer is in a range from about 0.3 nm to about 1.5 nm in some embodiments.

Figure 8B:
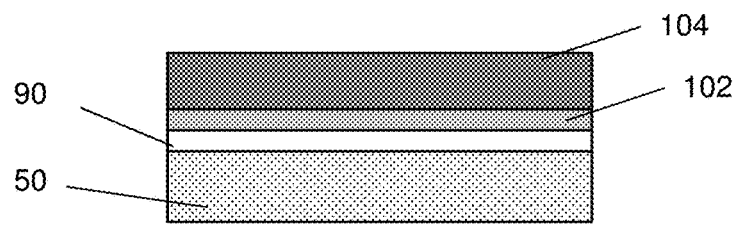

Then, as shown in FIG. 8B, a TaN layer 104, as an upper barrier layer, is formed on the TiN layer 102. The TaN layer 104 can be formed by CVD, PVD or ALD and the thickness of the TaN layer is in a range from about 1.0 nm to about 4.0 nm in some embodiments. In other embodiments, WN or TiN doped with Si is used as the upper barrier layer.

Figure 8C:
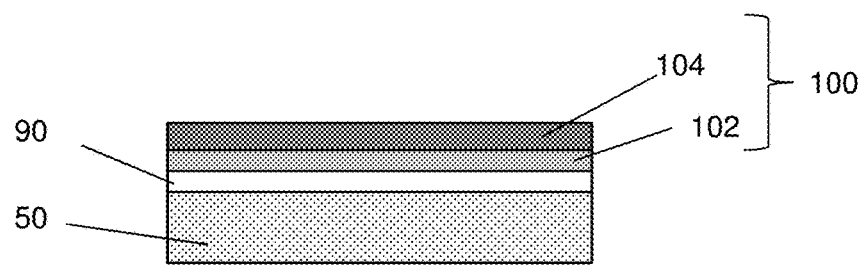

Next, as shown in FIG. 8C, the TaN layer 104 is etched to reduce the thickness thereof. In one embodiment, a chemical etching operation using $WCl_5$ gas is used to remove the upper portion of the TaN layer 104. In some embodiments, plasma etching is used. The thickness of the TaN layer after the etching is in a range from about 0.1 nm to about 2.0 nm, in some embodiments. Forming a TaN layer and etching the TaN layer (a deposition and etching operation) may be repeated to obtain a desired thickness.

Further, in certain embodiments, the TiN layer 102 is subjected to the deposition and etching operation. After the TiN layer 102 is formed by CVD, PVD or ALD with a thickness of about 1.0 nm to about 4.0 nm and before the TaN layer 104 is formed, the TiN layer 102 is etched to reduce the thickness thereof into a range from about 0.1 nm to about 2.0 nm, in some embodiments. In some embodiments, a chemical etching operation using an HCl and $H_2O_2$ solution is used to remove the upper portion of the TiN layer 102. Both the TiN layer 102 and the TaN layer 104 or one of them may be subjected to the deposition and etching operation.

With these operations, it is possible to uniformly form the barrier layer 100 (TiN layer and TaN layer) having the thickness of about 0.2 nm to about 3.0 nm. In some embodiments, the variation of the thickness of the barrier layer, i.e., a range between a largest thickness ($T_H$) and a smallest thickness ($T_L$) of the barrier layer is more than 0% and less than 10% of an average thickness (Av) of the barrier layer ($0<(T_H-T_L)/Av<0.1\times Av$). In certain embodiments, the variation of the thickness of the barrier layer is less than 5%.

Further, in certain embodiments, the lower barrier layer (TiN layer 104) is not formed. In such a case, the barrier layer 100 is made of TaN, TiN, WN or TiN doped with Si.

After the barrier layer 100 is formed, in S107 of FIG. 1, the work function adjustment metal (WFM) layer 110, as a second conductive layer, is formed over the barrier layer 100, as shown in FIG. 9.

Figure 10:
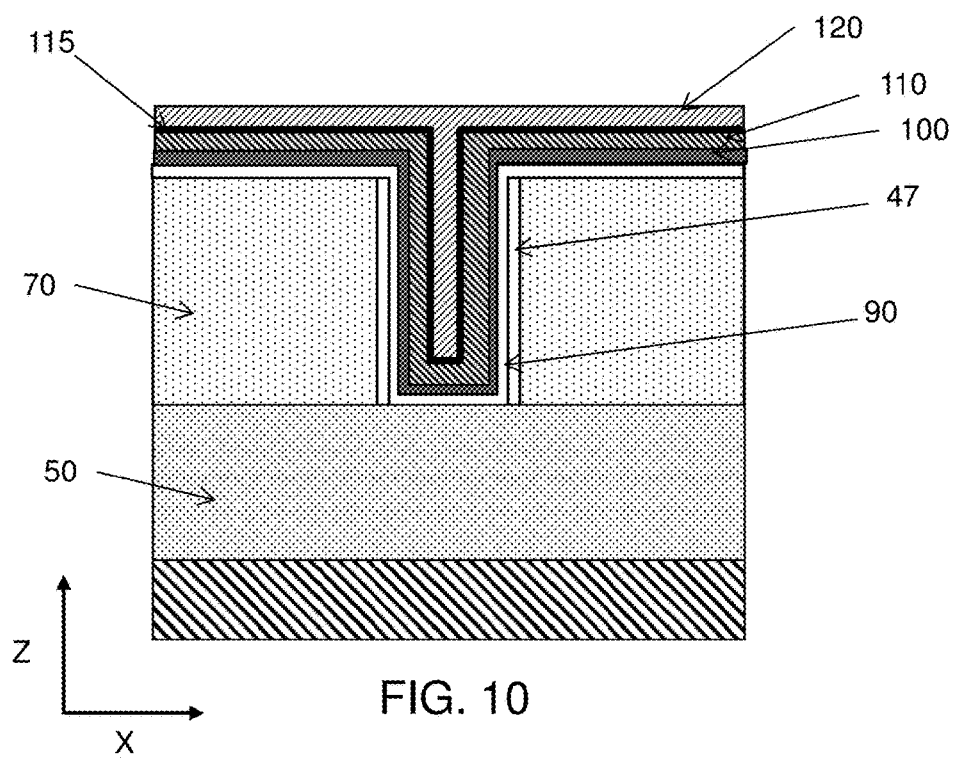

Further, in S108 of FIG. 1, a body metal layer 120, as a third conductive layer, is formed over the WFM layer 110, as shown in FIG. 10. In certain embodiments, a block layer 115, as a fourth conductive layer made of, for example, TiN, is formed on the WFM layer 110 before forming the body metal layer 120.

The body metal layer 120 includes one or more layers of any suitable metal materials, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In this embodiment, tungsten (W) is used as the body metal layer 120. The W layer 120 may be formed by an ALD and/or CVD using $WCl_5$ and $H_2$ as source gases. The thickness of the W layer 120 is in a range from about 5 nm to about 20 nm in some embodiments.

Figure 11:
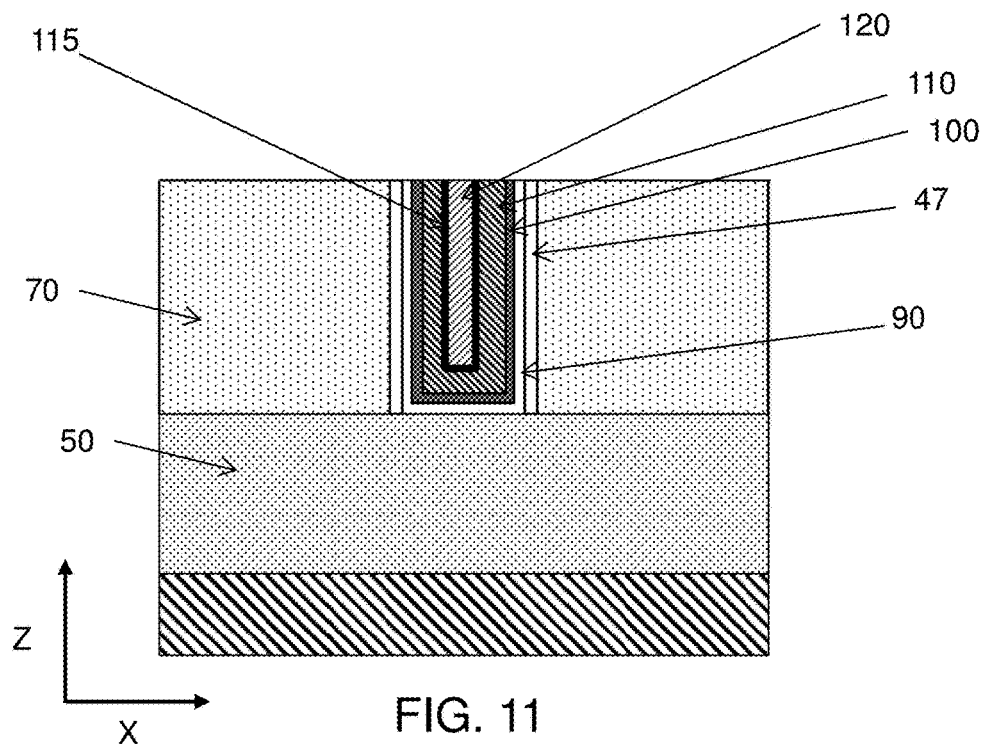
Figure 12:
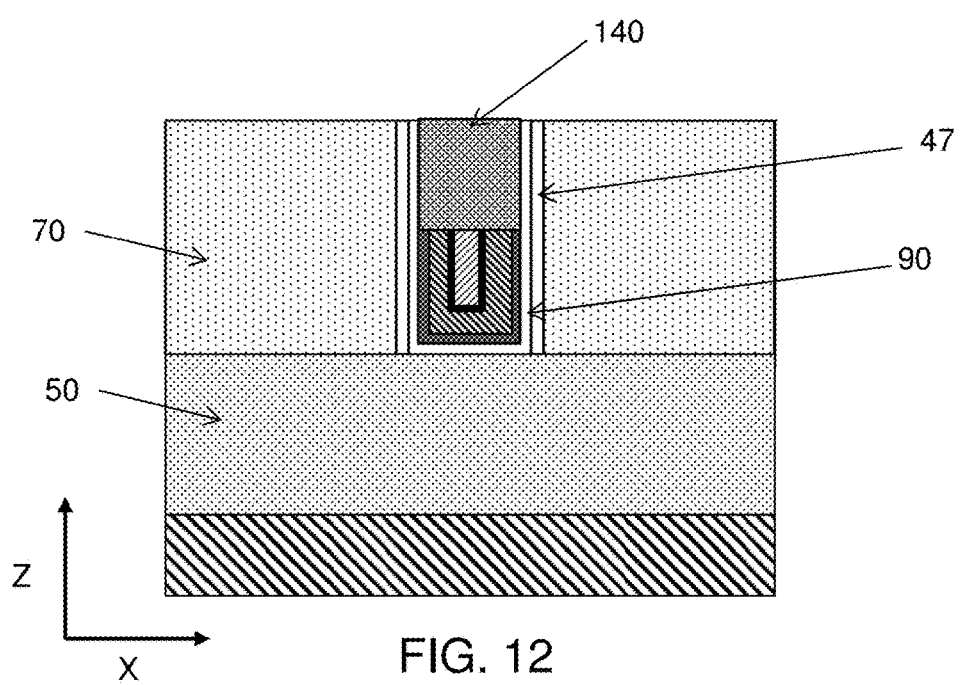

In S109 of FIG. 1, after the W layer 120 is formed, a planarization operation, such as CMP, is performed such that the metal layers formed over the upper surface of the ILD layer 70 are removed, as shown in FIG. 11. In some embodiments, the gate dielectric layer 90 formed over the upper surface of the ILD layer 70 is also removed. Further, the metal gate layers formed in the space 80 are partially removed (recessed), and an insulating cap layer 140 is formed as shown in FIG. 12 in some embodiments. The insulating cap layer 140 is made of, for example, a silicon nitride layer, formed by CVD or ALD. A planarization operation such as CMP may be performed after the deposition of silicon nitride.

It is understood that the structure shown in FIG. 12 may undergo further CMOS processes to form various features such as contacts/vias, interconnect metal layers, dielectric layers, passivation layers, etc.

In the foregoing embodiments, a Fin FET device as an FET is fabricated. In other embodiments, the foregoing metal gate structure and method for fabrication thereof can be applied to a planar type FET.

In the present disclosure, the thickness of the barrier layer under the WFM layer is controlled to be in a range of about 0.2 nm to about 3.0 nm. The threshold voltage of an n-channel FET can be controlled to a desirable value as the gate length changes in a range of about 5 nm to about 15 nm.

It will be understood that not all advantages have been necessarily discussed herein, no particular advantage is required for all embodiments or examples, and other embodiments or examples may offer different advantages.

In accordance with one aspect of the present disclosure, in a method of forming a gate structure, a gate dielectric layer is formed over a channel layer made of a semiconductor material. A first conductive layer is formed over the gate dielectric layer. A second conductive layer is formed over the first conductive layer. A third conductive layer is formed over the second conductive layer. The forming the first conductive layer includes depositing a conductive material and etching the deposited conductive material to reduce a thickness of the deposited conductive material. A thickness of the first conductive layer is in a range of 0.2 nm to 3.0 nm after the gate structure is formed.

In accordance with another aspect of the present disclosure, in a method of manufacturing a semiconductor device, a dummy gate structure is formed over a substrate. An interlayer insulating layer is formed over the dummy gate structure and the substrate. The dummy gate structure is removed so that a space corresponding to the dummy gate structure is formed. A gate dielectric layer is formed in the space. A first conductive layer is formed over the gate dielectric layer in the space. A second conductive layer is formed over the first conductive layer. A third conductive layer is formed over the second conductive layer. The first conductive layer includes one or more conductive layers. The forming the first conductive layer includes depositing a conductive material and etching the deposited conductive material to reduce a thickness of the deposited conductive material. A thickness of the first conductive layer is in a range of 0.2 nm to 3.0 nm after the gate structure is formed.

In accordance with another aspect of the present disclosure, a semiconductor device includes a field effect transistor (FET), which includes a channel layer made of a semiconductor and a metal gate structure. The metal gate structure includes a gate dielectric layer, a barrier layer formed on the gate dielectric layer, a work function adjustment layer formed on the barrier layer and made of one of Al and TiAl, a blocking layer formed on the work function adjustment layer and made of TiN, and a body metal layer formed on the blocking layer and made of W. A gate length over the channel layer is in a range from 5 nm to 15 nm, and a thickness of the first conductive layer is in a range of 0.2 nm to 3.0 nm. A range between a largest thickness and a smallest thickness of the first conductive layer is more than 0% and less than 10% of an average thickness of the first conductive layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a gate structure, comprising:
forming a gate dielectric layer over a channel layer made of a semiconductor material;
forming a first conductive layer over the gate dielectric layer, the first conductive layer including TiN doped with Si;
forming a second conductive layer over the first conductive layer; and
forming a third conductive layer over the second conductive layer, wherein:
the forming the first conductive layer includes:
depositing a conductive material; and
etching the deposited conductive material to reduce a thickness of the deposited conductive material, and
a thickness of the first conductive layer is in a range of 0.2 nm to 3.0 nm after the gate structure is formed.

2. A method of forming a gate structure, comprising:
forming a gate dielectric layer over a channel layer made of a semiconductor material;
forming a first conductive layer over the gate dielectric layer;
forming a second conductive layer over the first conductive layer; and
forming a third conductive layer over the second conductive layer, wherein:
a thickness of the first conductive layer is in a range of 0.2 nm to 3.0 nm after the gate structure is formed,
the first conductive layer includes one or more conductive layers, and
the forming the first conductive layer includes:
forming a TaN layer; and
etching the TaN layer to reduce a thickness of the TaN layer by plasma using WCl$_5$ gas.

3. The method of claim 2, wherein the thickness of the TaN layer after the etching is 0.2 nm to 2.0 nm.

4. The method of claim 2, wherein the forming the first conductive layer further includes, before forming the TaN layer, forming a TiN layer.

5. The method of claim 4, wherein a thickness of the TiN layer is in a range from 0.3 nm to 1.5 nm after the gate structure is formed.

6. The method of claim 2, wherein:
the second conductive layer includes one or more of Al and TiAl, and
the third conductive layer includes W.

7. The method of claim 6, further comprising forming a fourth conductive layer between the second conductive layer and the third conductive layer.

8. The method of claim 7, wherein the fourth conductive layer is TiN.

9. A method of manufacturing a semiconductor device, the method comprising:
forming a dummy gate structure over a substrate;
forming an interlayer insulating layer over the dummy gate structure and the substrate;
removing the dummy gate structure so that a space corresponding to the dummy gate structure is formed;
forming a gate dielectric layer in the space;
forming a first conductive layer over the gate dielectric layer in the space;
forming a second conductive layer over the first conductive layer; and
forming a third conductive layer over the second conductive layer, wherein:
the first conductive layer includes one or more conductive layers,
a thickness of the first conductive layer is in a range of 0.2 nm to 3.0 nm after the gate structure is formed,
the forming the first conductive layer includes:
forming a TaN layer; and
etching the TaN layer to reduce a thickness of the TaN layer,
the second conductive layer includes one or more of Al and TiAl, and
the third conductive layer includes W.

10. The method of claim 9, wherein the TaN layer is etched by plasma using WCl$_5$ gas.

11. The method of claim 9, wherein the thickness of the TaN layer after the etching is in a range from 0.2 nm to 2.0 nm.

12. The method of claim 9, further comprising forming a TiN layer between the second conductive layer and the third conductive layer.

13. The method of claim 9, wherein the forming the first conductive layer further includes, before forming the TaN layer, forming a TiN layer over the gate dielectric layer.

14. The method of claim 13, wherein a thickness of the TiN layer is in a range from 0.3 nm to 1.5 nm after the gate structure is formed.

15. A semiconductor device, comprising a field effect transistor, wherein:
the FET includes a channel layer made of a semiconductor and a metal gate structure,
the metal gate structure includes:
a gate dielectric layer;
a first conductive layer as a barrier layer formed on the gate dielectric layer;
a work function adjustment layer formed on the barrier first conductive layer and made of one of Al and TiAl;
a blocking layer formed on the work function adjustment layer and made of TiN; and
a body metal layer formed on the blocking layer and made of W, wherein:
a gate length over the channel layer is in a range from 5 nm to 15 nm,
a thickness of the first conductive layer is in a range of 0.2 nm to 3.0 nm, and
a range between a largest thickness and a smallest thickness of the first conductive layer is more than 0% and less than 10% of an average thickness of the first conductive layer.

16. The semiconductor device of claim 15, wherein the first conductive layer includes TiN doped with Si.

* * * * *